(12) United States Patent
Xi

(10) Patent No.: US 11,094,621 B2
(45) Date of Patent: Aug. 17, 2021

(54) DISPLAY PANEL

(71) Applicant: Au Optronics Corporation, Hsinchu (TW)

(72) Inventor: Peng-Bo Xi, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 196 days.

(21) Appl. No.: 16/592,789

(22) Filed: Oct. 4, 2019

(65) Prior Publication Data
US 2020/0211941 A1 Jul. 2, 2020

(30) Foreign Application Priority Data

Dec. 26, 2018 (TW) .................................. 107147160
Jul. 1, 2019 (TW) .................................. 108123124

(51) Int. Cl.
*H01L 23/498* (2006.01)
*H01L 25/075* (2006.01)
*H01L 27/15* (2006.01)

(52) U.S. Cl.
CPC .... *H01L 23/49811* (2013.01); *H01L 25/0753* (2013.01); *H01L 27/156* (2013.01)

(58) Field of Classification Search
CPC ........... H01L 23/49811; H01L 25/0753; H01L 27/156; H01L 33/62

USPC .......................................................... 257/88
See application file for complete search history.

(56) References Cited

U.S. PATENT DOCUMENTS

2009/0179831 A1* 7/2009 Yamashita ............... G09G 3/30
345/76
2016/0315044 A1* 10/2016 Cheng ..................... H05K 1/115

FOREIGN PATENT DOCUMENTS

TW     I669816     8/2019

* cited by examiner

*Primary Examiner* — Long K Tran
(74) *Attorney, Agent, or Firm* — JCIPRNET

(57) ABSTRACT

A display panel includes a substrate having an active zone, a pad zone, an external component zone, and a fan-out zone, a plurality of light-emitting elements disposed in the active zone, and a plurality of wire structures. The wire structures include a first wire structure and a second wire structure. The first wire structure includes a plurality of first inner connecting ends, a plurality of first outer connecting ends, and a first body. The second wire structure includes a plurality of second inner connecting ends, a plurality of second outer connecting ends, and a second body. The first wire structure has a first current A1, the second wire structure has a second current A2, and A1>A2. A number of the first inner connecting ends of the first wire structure is N1, a number of the second inner connecting ends of the second wire structure is N2, and N1>N2.

16 Claims, 9 Drawing Sheets

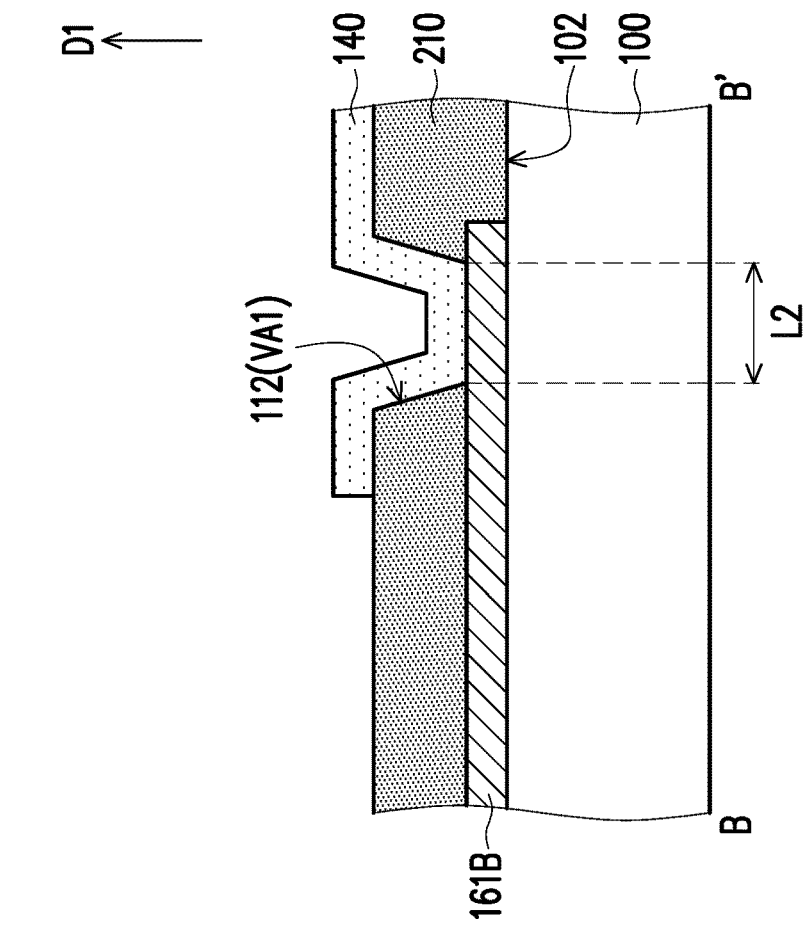
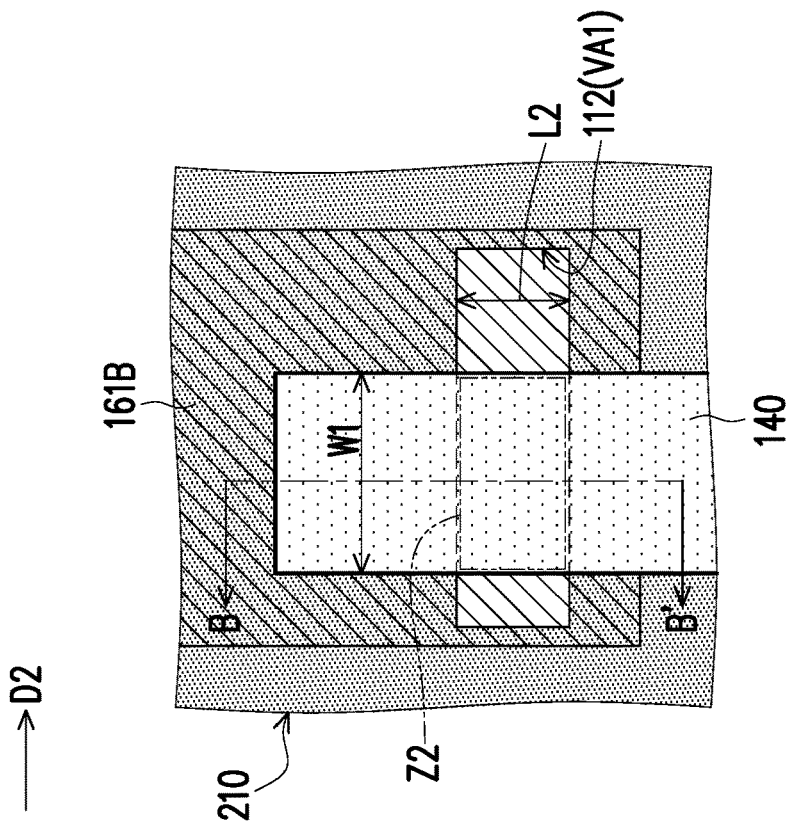

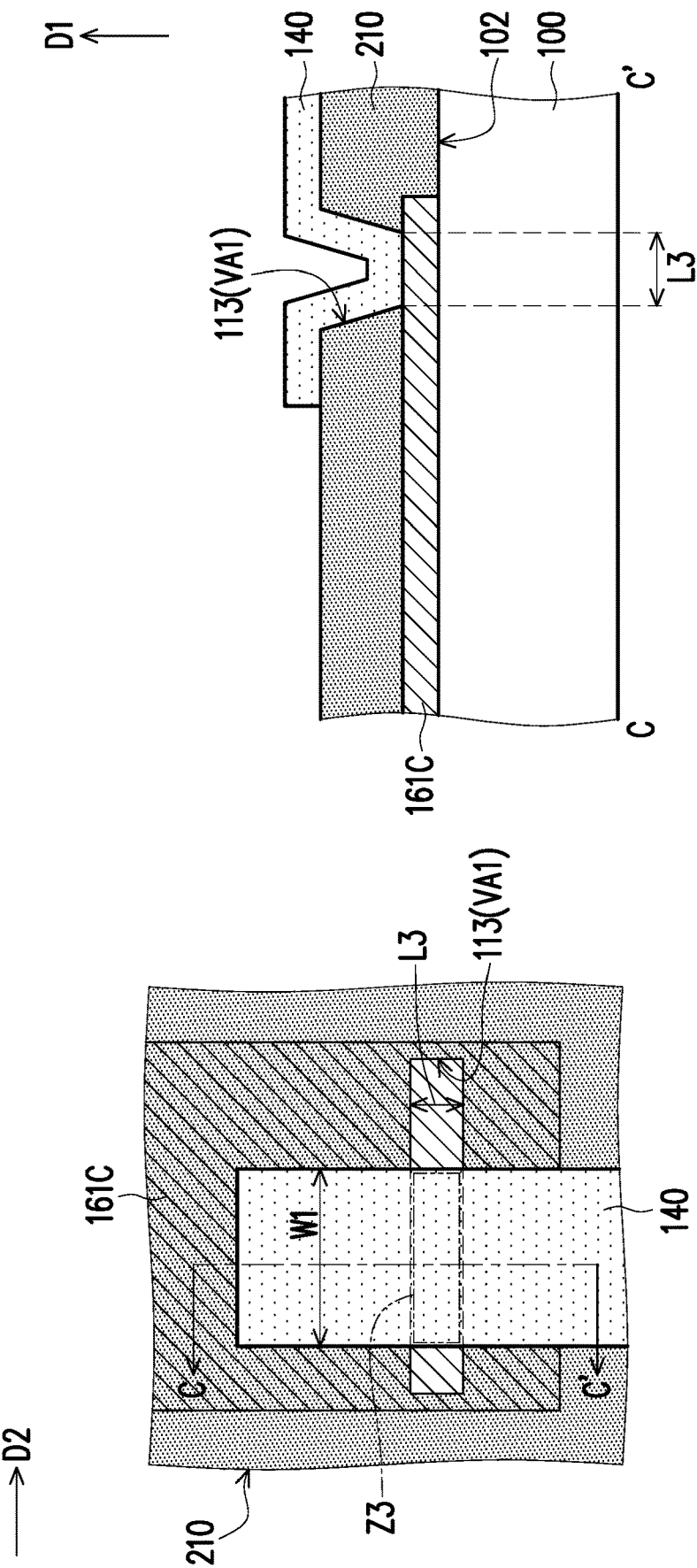

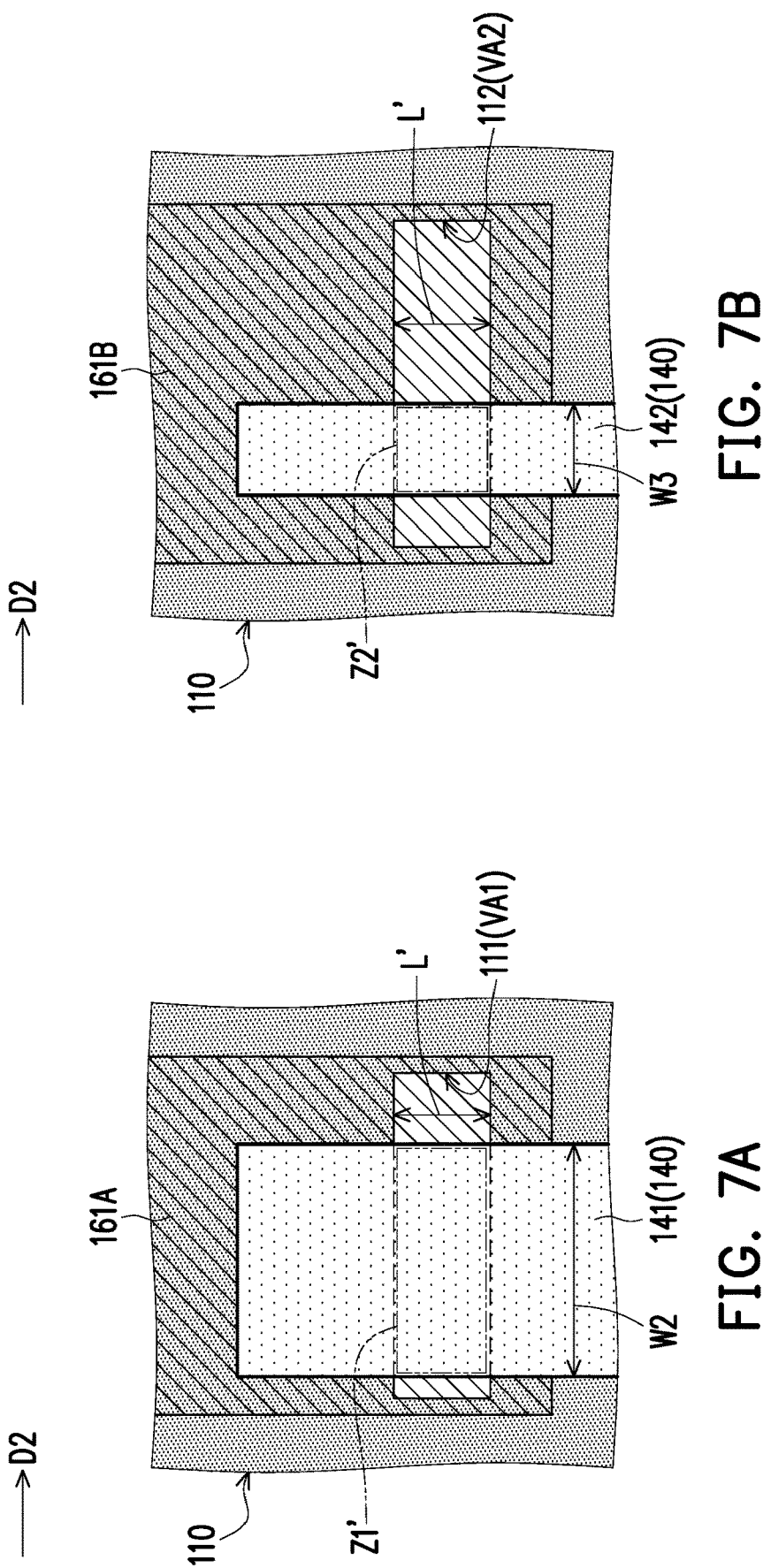

DISPLAY PANEL

CROSS-REFERENCE TO RELATED APPLICATION

This application claims the priority benefits of Taiwan application serial no. 107147160, filed on Dec. 26, 2018, and Taiwan application serial no. 108123124, filed on Jul. 1, 2019. The entirety of the above-mentioned patent applications are hereby incorporated by reference herein and made a part of this specification.

BACKGROUND OF THE INVENTION

1. Field of the Invention

The present invention relates to a display panel, and more particularly to a display panel having a uniform overall average current density.

2. Description of Related Art

With the popularity of display panels, ranging from home TV, e-sports screens, large outdoor billboards, public message screens in stores, to even portable or wearable electronic devices, the display panels can be seen. In recent years, in addition to the continuous improvement of the mainstream size of display panels, in response to consumer demand for high-end electronic products, display panels with narrow bezels or seamless splicing are one of the key projects actively developed by many panel manufacturers.

In a display panel with a narrow bezel, a plurality of fan-out lines on the pixel array substrate for connecting the driving element (for example, a chip on film (COF), or a gate driving element) and the signal line (for example, a data line or a scan line) have different extension lengths, so that the impedance difference is more obvious, thereby causing uneven overall average current density of the display panel, resulting in a problem of low reliability.

SUMMARY OF THE INVENTION

The present invention provides a display panel with uniform average current density of different wire structures, which can improve the reliability and display quality of the display panel.

The display panel of the present invention includes a substrate having an active zone, a pad zone, an external component zone, and a fan-out zone between the pad zone and the external component zone, a plurality of light-emitting elements disposed in the active zone, and a plurality of wire structures disposed in the fan-out zone, the pad zone and the external component zone. The wire structures include a first wire structure and a second wire structure. The first wire structure includes a plurality of first inner connecting ends, a plurality of first outer connecting ends, and a first body electrically connected to the first inner connecting ends and the first outer connecting ends. The first inner connecting ends are located between the light-emitting elements and the first body. The second wire structure includes a plurality of second inner connecting ends, a plurality of second outer connecting ends, and a second body electrically connected to the second inner connecting ends and the second outer connecting ends. The second inner connecting ends are located between the light-emitting elements and the second body. The first wire structure has a first current A1, the second wire structure has a second current A2, and A1>A2.

$$J1 = \frac{A1}{N1} \cdot J2 = \frac{A2}{N2} \cdot 50\% \times J1 \leq J2 \leq J1.$$

A number of the first inner connecting ends of the first wire structure is N1, a number of the second inner connecting ends of the second wire structure is N2, and N1>N2.

The display panel of the present invention includes a substrate having an active zone, a pad zone, an external component zone, and a fan-out zone between the pad zone and the external component zone, a plurality of light-emitting elements disposed in the active zone, and a plurality of wire structures disposed in the fan-out zone, the pad zone and the external component zone. The wire structures include a first wire structure and a second wire structure. The first wire structure includes a plurality of first inner connecting ends, a plurality of first outer connecting ends, and a first body electrically connected to the first inner connecting ends and the first outer connecting ends. The second wire structure includes a plurality of second inner connecting ends, a plurality of second outer connecting ends, and a second body electrically connected to the second inner connecting ends and the second outer connecting ends. A number of the first inner connecting ends of the first wire structure is N1, and a number of the second inner connecting ends of the second wire structure is N2. The first wire structure has a first current A1, and the second wire structure has a second current A2. Each of the first inner connecting ends has a first current density J1, $$J1 = \frac{A1}{N1},$$

each of the second inner connecting ends has a second current density J2, $$J2 = \frac{A2}{N2},$$

and 50%×J1≤J2·J1.

Based on the above, the display panel according to an embodiment of the present invention has different resistances and currents due to different extension lengths of the different wire structures, so that the average current density of the wires structures carrying different currents can be made uniform by controlling the number and total area of the inner connecting ends of the wire structure contacting the connection structure, thereby controlling the overall average current density of the display panel. In this way, in addition to reducing the probability of high current density burning traces, the reliability and display quality of the display panel can be improved.

In order to make the aforementioned and other objectives and advantages of the present invention comprehensible, embodiments accompanied with figures are described in detail below.

BRIEF DESCRIPTION OF THE DRAWINGS

FIG. 4A is a partial top view showing a second inner connecting end of a display panel according to an embodiment of the present invention.

FIG. 4B is a cross-sectional view along line B-B' of the display panel of FIG. 4A.

FIG. 5A is a partial top view showing a third inner connecting end of a display panel according to an embodiment of the present invention.

FIG. 5B is a cross-sectional view along line C-C' of the display panel of FIG. 5A.

FIG. 7A is a partial top view showing a first inner connecting end of a display panel according to still another embodiment of the present invention.

FIG. 7B is a partial top view showing a second inner connecting end of a display panel according to still another embodiment of the present invention.

DESCRIPTION OF THE EMBODIMENTS

Figure 1:
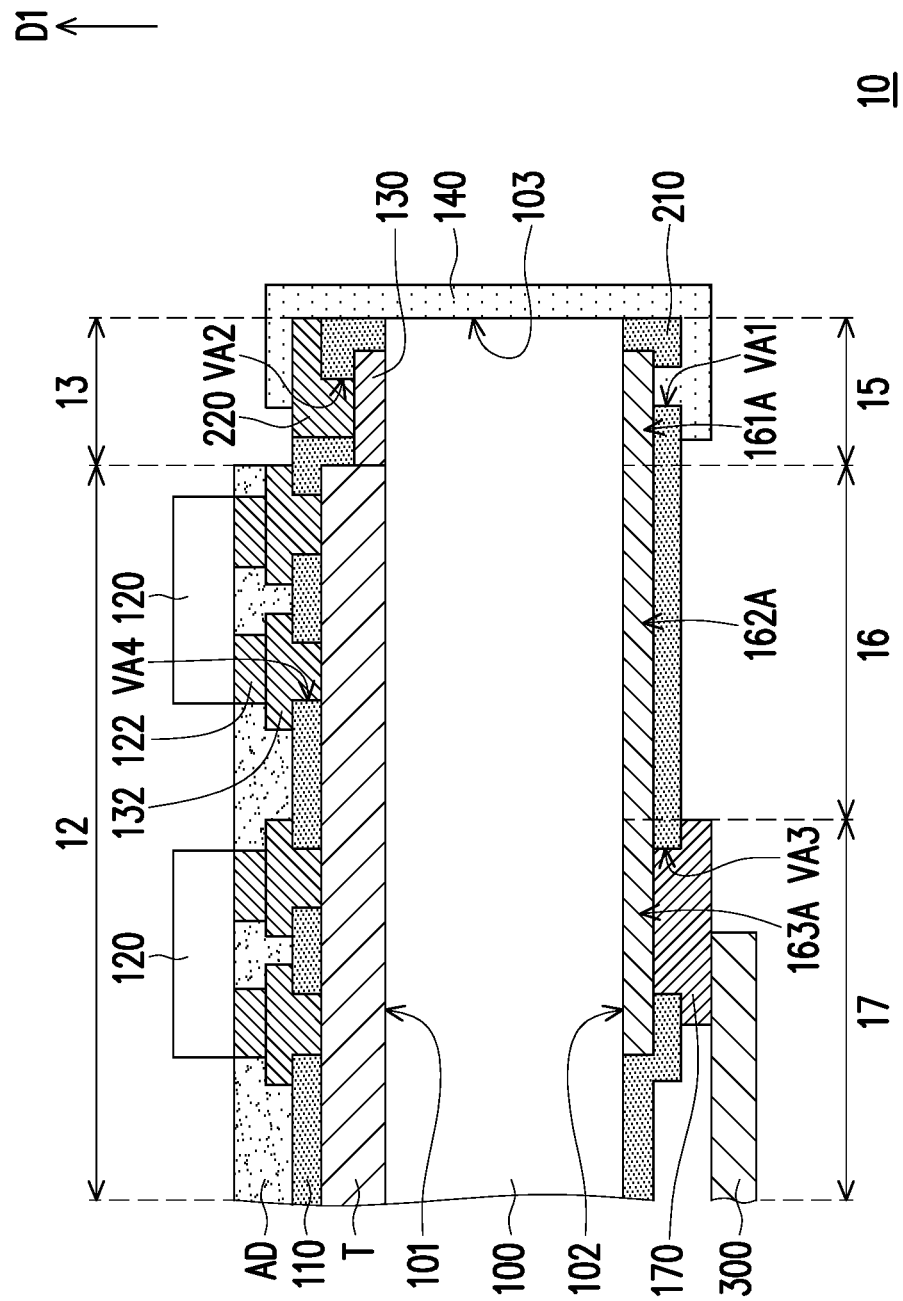
FIG. 1 is a cross-sectional view of a display panel according to an embodiment of the present invention.

In order to make the aforementioned and other objectives and advantages of the present invention comprehensible, embodiments accompanied with figures are described in detail below. It would be appreciated by a person skilled in the art that the embodiments described may be modified in various manners without departing from the spirit and scope of the present invention.

In the figures, the thicknesses of layers, films, panels, regions, and the like are enlarged for clarity. Throughout the specification, same reference numerals indicate same components. It should be understood that when a component such as a layer, film, region or substrate is referred to as being "on" or "connected" to another component, it may be directly on or connected to the another component, or intervening components may also be present. In contrast, when a component is referred to as being "directly on" or "directly connected to" another component, there are no intervening assemblies present. As used herein, "connection" may refer to a physical and/or electrical connection.

It should be understood that although terms such as "first", "second", and "third" in this specification may be used for describing various elements, components, areas, layers, and/or parts, the elements, components, areas, layers, and/or parts are not limited by such terms. The terms are only used to distinguish one element, component, area, layer, or part from another element, component, area, layer, or part. Therefore, the "first element", "component, "area", "layer", or "part" described below may also be referred to as a second element, component, area, layer, or part without departing from the teachings of the present invention.

The terms used herein are merely used for describing particular embodiments rather than limiting the present invention. As used in this specification, the articles "a", "an", and "the" are intended to include plural forms and include "at least one", unless the context clearly indicates otherwise. "Or" means "and/or". As used herein, the term "and/or" includes any and all combinations of one or more related items listed. It should also be understood that as used in this specification, the term "comprises," "includes," and "has" specify the presence of stated features, numbers, operations, members, elements, and/or combinations thereof, but do not preclude the presence or addition of one or more other features, numbers, operations, members, elements, and/or combinations thereof.

In addition, spatially relative terms such as "below", "bottom", "on" or "top" are used in this specification to describe a relationship between one element and another element, as shown in the figures. It should be understood that such spatially relative terms are intended to encompass different orientations of the device in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the present invention belongs. It will be further understood that terms such as those defined in commonly used dictionaries should be interpreted as having a meaning that is consistent with their meaning in the context of the relevant art and the present invention and will not be interpreted in an idealized or overly formal sense unless expressly so defined herein.

Exemplary embodiments are described herein with reference to cross-sectional views that are schematic views of an idealized embodiment. Thus, variations in the shapes of the illustrations as a result of, for example, manufacturing techniques and/or tolerances can be contemplated. Thus, the embodiments described herein are not to be construed as limited to the particular shapes of the regions as illustrated herein, but include, for example, shape deviations caused by manufacturing. For example, regions shown or described as flat may generally have rough and/or non-linear features. Furthermore, the acute angles shown may be round. Therefore, the regions shown in the figures are schematic in nature, and their shapes are not intended to illustrate the precise shapes of the regions and are not intended to limit the scope of the claims.

Figure 2:
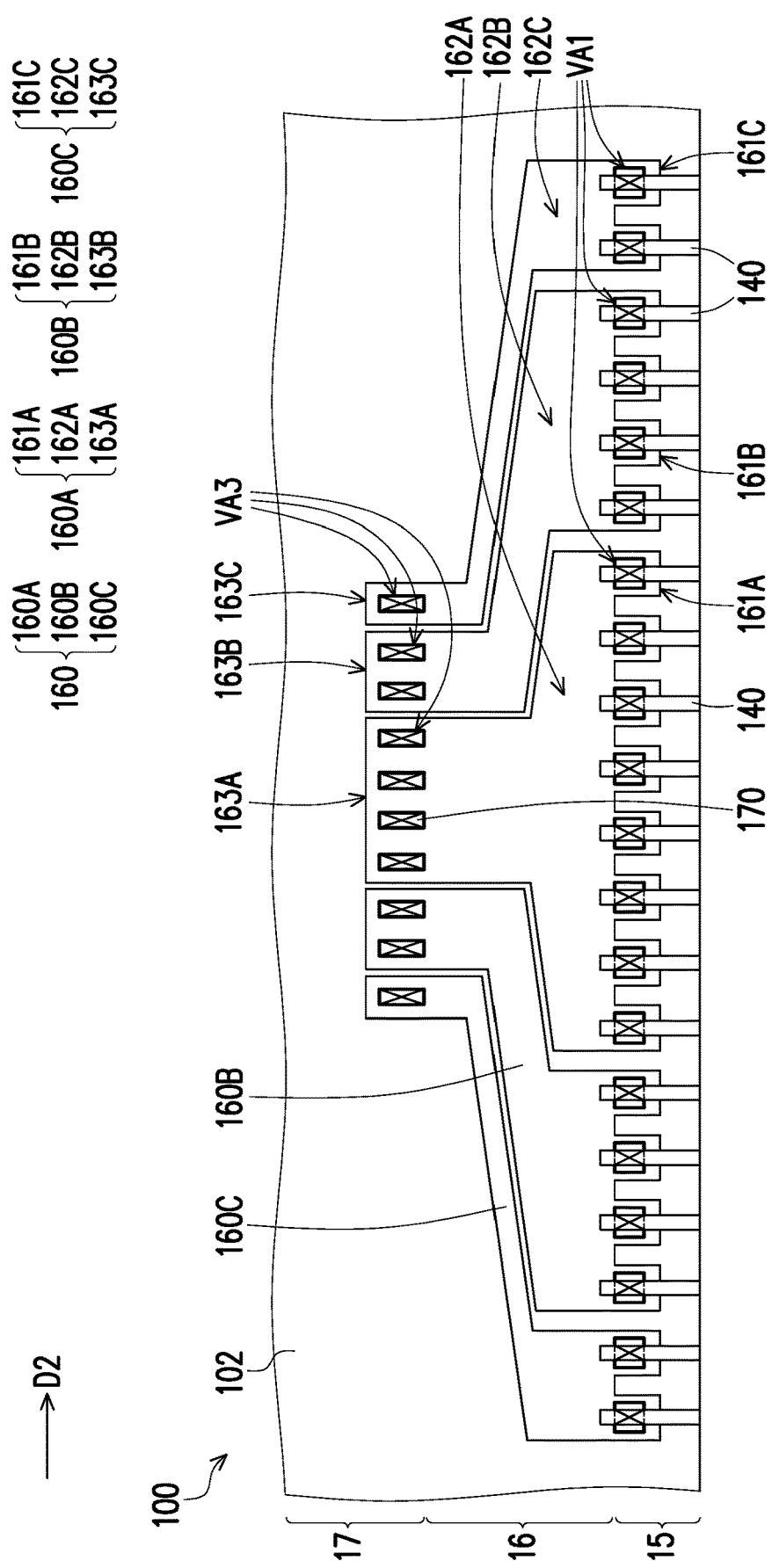
FIG. 2 is a partial top view showing a lower surface of a display panel according to an embodiment of the present invention.

FIG. 1 is a cross-sectional view of a display panel according to an embodiment of the present invention. FIG. 2 is a partial top view showing a lower surface of a display panel according to an embodiment of the present invention. FIG. 2 is a schematic illustration of only a part of the components for ease of illustration and observation. Please referring to FIG. 1 and FIG. 2, in the present embodiment, the display panel 10 includes: a substrate 100, having an active zone 12, a pad zone 15, an external component zone 17, and a fan-out zone 16 between the pad zone 15 and the external component zone 17; a plurality of light-emitting elements 120, disposed in the active zone 12; a plurality of wire structures 160, disposed in and overlapping the fan-out zone 16, the pad zone 15 and the external component zone 17; and a plurality of outer pads 170, disposed in the external component zone 17. The wire structures 160 include a first wire structure 160A and a second wire structure 160B. The first wire structure 160A is connected to a part of the outer pads 170 at the first outer connecting ends 163A thereof, and the second wire structure 160B is connected to the other part of the outer pads 170 at the second outer connecting ends 163B thereof, but the present invention is not limited thereto. In addition, the display panel 10 further includes a plurality of upper pads 130 located in an upper pad zone 13. In addition, the display panel 10 further includes a plurality of connection structures 140. In the present embodiment, the upper pad zone 13 is located between a side surface 103 of the substrate 100 (i.e., a side wall of the substrate 100) and the active zone 12. From another perspective, in a direction D1 perpendicular to the substrate 100, the upper pad zone 13 corresponds to and overlaps the pad zone 15. As shown in FIG. 1, the connection structure 140 is electrically connected to the upper pad 130, and extends from an upper surface 101 of the substrate 100 along the side wall 103 to a lower surface 102 opposite to the upper surface 101 to electrically connect the upper pad 130 to the wire structure 160. In other words, the upper pad 130 is located on the upper surface 101 of the substrate 100, and the wire structure 160 is located on the lower surface 102 of the substrate 100. In addition, the display panel 10 further includes an external circuit component 300 electrically connected to the outer pad 170 to electrically connect the external circuit component 300 to the light-emitting elements 120 through the wire structure 160, the connection structure 140 and the upper pad 130. In the present embodiment, the display panel 10 is, for example, a bezel-less display panel applied to seamless splicing, and will be briefly described below with the above application.

Please referring to FIG. 1, in the present embodiment, the substrate 100 includes an upper surface 101 and a lower surface 102 opposite to the upper surface 101 and a side surface 103 between the upper surface 101 and the lower surface 102 in a direction D1 perpendicular to the substrate 100. The active zone 12 and the upper pad zone 13 are located on the upper surface 101, and the pad zone 15, the fan-out zone 16 and the external component zone 17 are located on the lower surface 102. The material of the substrate 100 may be glass, quartz, an organic polymer, an opaque/reflective material (e.g., a conductive material, a metal, a wafer, a ceramic, or other applicable material) or other applicable materials. If a conductive material or metal is used, the substrate 100 is covered with a layer of insulating material (not shown) to avoid short circuit problems.

Figure 6A:
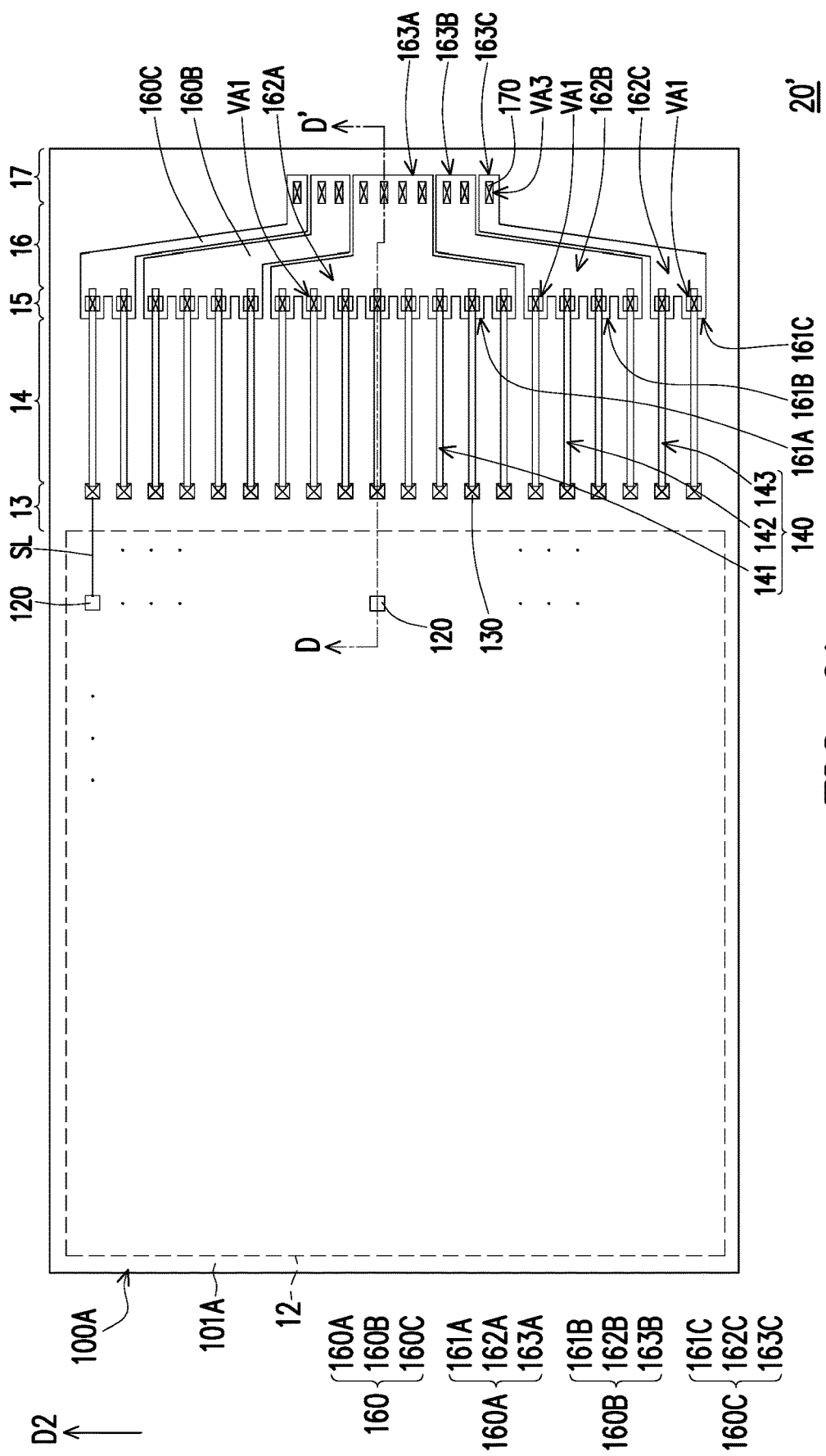
FIG. 6A is a top view of a display panel before bending according to another embodiment of the present invention.

As shown in FIG. 1, the active component layer T is disposed on the upper surface 101 of the substrate 100 and is located in the active zone 12. The active component layer T is, for example, an active component array, and includes a dielectric layer (not shown), a plurality of active components (not shown), and a plurality of signal lines or power lines (for example, signal lines SL as shown in FIG. 6A) connecting the active components. The active components described above include a thin film transistor (TFT). The thin film transistor is, for example, a low temperature poly-Si (LTPS) thin film transistor or an amorphous Si (a-Si) thin film transistor, but the present invention is not limited thereto. In the present embodiment, the signal line of the active component layer T (for example, the signal line SL shown in FIG. 6A) can be electrically connected to the upper pad 130 located in the upper pad zone 13, but the present invention is not limited thereto. In addition, the active component layer T may further be provided with a plurality of contacts 132, and the contacts 132 may be electrically connected to the active component layer T, but the present invention is not limited thereto.

In the present embodiment, the insulating layer 110 may cover the upper pad 130 and the active component layer T, and the insulating layer 110 has a plurality of openings VA2, VA4 to respectively expose the upper pad 130 and the active component layer T, but the present invention is not limited thereto. In detail, the opening VA2 may be formed in the upper pad zone 13 and overlap the upper pad 130, and the opening VA4 may be formed in the active zone 12 and overlap the active component layer T. In this way, the contact 132 can be disposed on the insulating layer 110 and contact the active component layer T through the opening VA4. In addition, an electrode 220 may be formed in the opening VA2 such that the electrode 220 contacts the upper pad 130. In the present embodiment, the material of the insulating layer 110 includes an organic material or an inorganic material. The organic material includes, for example, polyesters (PET), polyolefins, polyacrylamides, polycarbonates, polyalkylene oxides, polypropylenes, polyethers, polyketones, polyalcohols, polyaldehydes, other suitable materials or combinations thereof, but the present invention is not limited thereto. The inorganic material is, for example, silicon oxide, silicon nitride, silicon oxynitride, other suitable materials, or a stacked layer of at least two of the above materials, but the present invention is not limited thereto. In the present embodiment, the electrode 220 and the contact 132 are generally made of a metal material based on conductivity considerations, but the present invention is not limited thereto. In other embodiments, the electrode 220 may be of a single-layer or multilayer structure, and the material thereof is, for example, a transparent conductive layer (for example, indium tin oxide, indium zinc oxide, aluminum zinc oxide, indium antimony zinc oxide, or other suitable materials), or other suitable materials, and the present invention is not limited thereto.

As shown in FIG. 1, a plurality of light-emitting elements 120 are disposed in the active zone 12. In other words, the light-emitting elements 120 are located on the upper surface 101 of the substrate 100. In addition, an adhesive layer AD may be included and disposed between the insulating layer 110 and the light-emitting elements 120. In this way, the light-emitting element 120 can be bonded to the contact 132 through the adhesive layer AD, but the present invention is not limited thereto. In the present embodiment, the light-emitting element 120 further includes a bump 122. The bump 122 may contact the contact 132 to be electrically connected to the active component layer T. In this way, the light-emitting element 120 can be electrically connected to the upper pad 130 through the active component layer T. In the above arrangement, the light-emitting element 120 can be electrically connected to the external circuit component 300 through the active component layer T, the upper pad 130, the connection structure 140, the wire structure 160 and the outer pad 170 to receive the driving signal and electric power. In the present embodiment, the light-emitting element 120 is, for example, a light-emitting diode (LED), including a micro-LED, a mini-LED, and a quantum dot LED, but the present invention is not limited thereto. The external circuit component 300 includes a chip on film (COF), a flexible printed board, a driver circuit, or other suitable components, and the present invention is not limited thereto.

Referring to FIG. 1 and FIG. 2 simultaneously, in the present embodiment, a plurality of wire structures 160 are disposed in the pad zone 15 on the lower surface 102 of the substrate 100. It is to be noted that FIG. 2 is a partial top view of the lower surface 102 of the substrate 100. For the sake of clarity of illustration, only a plurality of wire structures 160 and a plurality of openings VA1, VA3 are schematically illustrated, and the insulating layer 210, the outer pads 170 and the external circuit component 300 are omitted. The description of the insulating layer 210, the outer pads 170 and the external circuit component 300 will be described later in the specification.

Referring to FIG. 1 and FIG. 2, the wire structures 160 are disposed in the fan-out zone 16, the pad zone 15 and the external component zone 17. In detail, the wire structures 160 may overlap the fan-out zone 16, the pad zone 15 and the outer component zone 17. For example, each of the wire structures 160 can extend from the pad zone 15 through the fan-out zone 16 to the external component zone 17. In the present embodiment, the wire structures 160 include a first wire structure 160A and a second wire structure 160B. In detail, as shown in FIG. 2, in the top view, the two second wire structures 160B may be respectively disposed on the left side and the right side of the first wire structure 160A. From another perspective, the first wire structure 160A is sandwiched between the two second wire structures 160B. However, the number of the first wire structures 160A and the number of the second wire structures 160B of the present invention are not limited to that shown in FIG. 2. In some embodiments, the number of the first wire structures 160A may also be multiple, which are disposed between two, four or more second wire structures 160B.

In the present embodiment, the first wire structure 160A includes a plurality of first inner connecting ends 161A, a plurality of first outer connecting ends 163A, and a first body 162A electrically connected to the first inner connecting ends 161A and the first outer connecting ends 163A. As shown in FIG. 1 and FIG. 2, the first inner connecting ends 161A are disposed in the pad zone 15, the first outer connecting ends 163A are disposed in the external component zone 17, and the first body 162A is disposed in the fan-out zone 16. In detail, the first inner connecting ends 161A overlap the pad zone 15, the first outer connecting ends 163A overlap the external component zone 17, and the first body 162A overlaps the fan-out zone 16. That is, the cross-sectional view of the display panel 10 shown in FIG. 1 is a cross-sectional view corresponding to the first wire structure 160A. In addition, as shown in FIG. 2, the second wire structure 160B includes a plurality of second inner connecting ends 161B, a plurality of second outer connecting ends 163B, and a second body 162B electrically connected to the second inner connecting ends 161B and the second outer connecting ends 163B. As shown in FIG. 2, the second inner connecting ends 161B are disposed in the pad zone 15, the second outer connecting ends 163B are disposed in the external component zone 17, and the second body 162B is disposed in the fan-out zone 16. In detail, the second inner connecting ends 161B overlap the pad zone 15, the second outer connecting ends 163B overlap the external component zone 17, and the second body 162B overlaps the fan-out zone 16. In the present embodiment, the plurality of first inner connecting ends 161A and the plurality of first outer connecting ends 163A are respectively located at two opposite ends of the first body 162A and are comb-shaped in the top view. The plurality of second inner connecting ends 161B and the plurality of second outer connecting ends 163B are respectively located at two opposite ends of the second body 162B and are comb-shaped in the top view, but the present invention is not limited thereto.

In the present embodiment, the wire structures 160 further include a third wire structure 160C. For example, the number of the third wire structures 160C is, for example, two, which are respectively located on the right side of the second wire structure 160B on the right side and/or on the left side of the second wire structure 160B on the left side. From another perspective, the first wire structure 160A and the second wire structure 160B may be sandwiched between the two third wire structures 160C, and the second wire structure 160B is located between the first wire structure 160A and the third wire structure 160C. However, the number of the third wire structures 160C of the present invention is not limited to that shown in FIG. 2. In some embodiments, the number of the third wire structures 160C may also be two, four or more, which are symmetrically disposed on the side of the second wire structure 160B to sandwich the first wire structure 160A and the second wire structure 160B between the plurality of third wire structures 160C, but the present invention is not limited thereto.

In the present embodiment, the third wire structure 160C includes a plurality of third inner connecting ends 161C, a plurality of third outer connecting ends 163C, and a third body 162C electrically connected to the third inner connecting ends 161C and the third outer connecting ends 163C. As shown in FIG. 2, the third inner connecting ends 161C are disposed in the pad zone 15, the third outer connecting ends 163C are disposed in the external component zone 17, and the third body 162C is disposed in the fan-out zone 16. In detail, the third inner connecting ends 161C overlap the pad zone 15, the third outer connecting ends 163C overlap the external component zone 17, and the third body 162C overlaps the fan-out zone 16. In the present embodiment, the plurality of third inner connecting ends 161C and the plurality of third outer connecting ends 163C are respectively located at two opposite ends of the third body 162C and the plurality of third inner connecting ends 161C are comb-shaped in the top view, but the present invention is not limited thereto.

In the present embodiment, as shown in FIG. 1, the display panel 10 may further include an insulating layer 210 disposed as a whole on the lower surface 102 and covering the plurality of wire structures 160 (including, for example, the first wire structure 160A, the second wire structure 160B and third wire structure 160C). In the present embodiment, the material of the insulating layer 210 includes an organic material or an inorganic material. The organic material includes, for example, polyesters (PET), polyolefins, polyacrylamides, polycarbonates, polyalkylene oxides, polypropylenes, polyethers, polyketones, polyalcohols, polyaldehydes, other suitable materials or combinations thereof, but the present invention is not limited thereto. The inorganic material is, for example, silicon oxide, silicon nitride, silicon oxynitride, other suitable materials, or a stacked layer of at least two of the above materials, but the present invention is not limited thereto.

As shown in FIG. 1, the insulating layer 210 has a plurality of openings VA1, VA3 to respectively expose the inner connecting ends and the outer connecting ends of the wire structure 160. Specifically, referring to FIG. 1 and FIG. 2 (FIG. 2 omits the insulating layer 210 for clarity of illustration, but shows the openings VA1, VA3), the openings VA1 are located in the pad zone 15 and are arranged along a direction D2. In the present embodiment, the openings VA1 are arranged, for example, in a single row. The openings VA1 may expose the first inner connecting ends 161A, the second inner connecting ends 161B, and the third inner connecting ends 161C. The openings VA3 are located in the external component zone 17, and are arranged along the direction D2. In the present embodiment, the openings VA3 are arranged, for example, in a single row. The openings VA3 may expose the first outer connecting ends 163A, the second outer connecting ends 163B, and the third outer connecting ends 163C. In other words, each opening VA1 may be disposed correspondingly to each inner connecting end, and each opening VA3 may be disposed correspondingly to each outer connecting end, but the present invention is not limited thereto.

In the present embodiment, a plurality of outer pads 170 are disposed in the external component zone 17. As shown in FIG. 1 and FIG. 2, the outer pads 170 are disposed on the insulating layer 210 on the lower surface 102 of the substrate 100, and contact the first outer connecting ends 163A, the second outer connecting ends 163B, and the third outer connecting ends 163C through the opening VA3. In other words, the outer pads 170 may be disposed correspondingly to the outer connecting ends 163A, 163B, 163C, and the outer pads 170 may serve as electrodes or contacts for electrical connection of the external circuit component 300. As such, the driving signals and currents of the external circuit component 300 can be supplied to the light-emitting element 120 through the wire structure 160, the connection structure 140, and the active component layer T.

The wire structure 160 and the outer pad 170 are generally made of a metal material based on conductivity considerations, but the present invention is not limited thereto. In other embodiments, the wire structure 160 and the outer pad 170 may also use other conductive materials, such as alloys, nitrides of metal materials, oxides of metal materials, oxynitrides of metal materials, or a stacked layer of metal materials and other conductive materials. In the present embodiment, the method for forming the upper pad 130, the wire structure 160 and the outer pad 170 includes physical vapor deposition (PVD), chemical vapor deposition (CVD), electroplating, or other suitable methods, but the present invention is not limited thereto.

As shown in FIG. 1 and FIG. 2, the extension length of the second body 162B correspondingly connected to the second inner connecting end 161B and the second outer connecting end 163B is greater than the extension length of the first body 162A correspondingly connected to the first inner connecting end 161A and first outer connecting end 163A. This is based on the fact that in the case where the display panel is increased in resolution, the numbers of required signal lines (for example, scan lines or power lines) and the corresponding upper pads 130 also increase. On the other hand, the number of the external circuit components 300 that provide driving signals and electric power and the number of the corresponding outer pads 170 do not need to be correspondingly increased in proportion. That is, the number of the inner connecting ends correspondingly overlapping the upper pads 130 is much larger than the number of the outer connecting ends correspondingly overlapping the outer pads 170. Under the above arrangement, the number of the outer connecting ends and the number of the inner connecting ends corresponsingly connected to any of the wire structures 160 are not equal. For example, in some embodiments, one outer connecting end may correspond to two, three or more inner connecting ends. In this way, the first body 162A is disposed in a fan-out mode in the top view, and has a width that gradually increases from the first outer connecting end 163A toward the first inner connecting end 161A. In addition, the second body 162B is also disposed in a fan-out mode in the top view, and has a width that gradually increases from the second outer connecting end 163B toward the second inner connecting end 161B. Thus, in a direction perpendicular to the direction D2, the extension length of the second body 162B of the second wire structure 160B on both sides of the first wire structure 160A is made greater than the extension length of the first body 162A. Moreover, it may be deduced by analogy that the extension length of the third body 162C of the third wire structure 160C located at the outermost side is greater than the extension length of the second body 162B.

In the present embodiment, the first wire structures 160A have a first resistance R1, the second wire structures 160B have a second resistance R2, and R2>R1. This is because the larger the length of the wire, the greater the resistance, and the extension length of the second body 162B is greater than the extension length of the first body 162A, so the second resistance R2 of the second wire structure 160B is greater than the first resistance R1 of the first wire structure 160A. It may be deduced by analogy that the third wire structure 160C has a third resistance R3, and R3>R2>R1.

In addition, the first wire structure 160A may receive a current from the external circuit component 300 through the outer pads 170 to have a first current A1. The second wire structure 160B may receive a current from the external circuit component 300 through the outer pads 170 to have a second current A2, and A1>A2. This is based on Ohm's law that under the same step voltage, the larger the resistance of the wire, the smaller the current flowing through it, and the second resistance R2 of the second body 162B is greater than the first resistance R1 of the first body 162A, so the first current A1 on the first wire structure 160A is greater than the second current A2 on the second wire structure 160B. It may be deduced by analogy that when the third resistance R3 is greater than the second resistance R2 and the first resistance R1, the third current A3 on the third wire structure 160C is smaller than the first current A1 and the second current A2, specifically, A1>A2>A3.

It should be noted that since the first current A1 carried by the first wire structure 160A is greater than the second current A2 carried by the second wire structure 160B, there is a phenomenon that the current is not uniform. If the number of the first inner connecting ends 161A of the first wire structure 160A is the same as the number of the second inner connecting ends 161B of the second wire structure 160B, the magnitude of current measured at the first inner connecting ends 161A (i.e., the average current density at the inner connecting ends) is different from the magnitude of current measured by the second inner connecting ends 161B, resulting in a negative impact on the reliability of the wire structures.

However, the number of the first inner connecting ends 161A of the first wire structure 160A of the present embodiment is N1 (for example, the first number), the number of the second inner connecting ends 161B of the second wire structure 160B is N2 (for example, the second number), and N1>N2. For example, as shown in FIG. 2, the first body 162A is connected to eight first inner connecting ends 161A, and the second body 162B is connected to four second inner connecting ends 161B, but the present invention is not limited thereto. From another perspective, compared with the second wire structure 160B, the first wire structure 160A carrying higher current has more first inner connecting ends 161A contacting the connection structure 140 (i.e., the total contact area with the connection structure 140 is larger), and the second conductor structure 160B carrying lower current has fewer second inner connecting ends 161B contacting the connection structure 140 (i.e., the total contact area with the connection structure 140 is smaller). In this way, the first current density J1 of each of the first inner connecting ends 161A and the second current density J2 of each of the second inner connecting ends 161B can be calculated according to the formula of the current density.

In the present embodiment, the current density can be defined as the magnitude of current measured at any one of the inner connecting ends of a wire structure 160. Specifically, the first current density $$J1 = \frac{A1}{N1},$$

where A1 is the first current, and N1 is the number of the first inner connecting ends 161A. The second current density $$J2 = \frac{A2}{N2},$$

where A2 the second current, and N2 is the number of the second inner connecting ends 161B. It can be seen from the above calculation formula that the number of the inner connecting ends of the wire structure 160 can adjust the current density.

Compared with the conventional design that the number of the inner connecting ends of any two wire structures in the display panel is the same (i.e., the number of the connection structures respectively correspondingly contacting the wire structures carrying higher current and the wire structures carrying lower current is the same), the current density on the inner connecting ends of the wire structures carrying higher current and the current density on the inner connecting ends of the wire structures carrying lower current are not uniform. The display panel 10 of the present embodiment can make the first wire structure 160A carrying higher current have more first inner connecting ends 161A contacting the connection structure 140 and the second wire structure 160B carrying lower current have less second inner connecting ends 161B contacting the connection structure 140. In this way, the average current density of the first current density J1 of the first inner connecting ends 161A and the second current density J2 of the second inner connecting ends 161B can be adjusted to be approximate or uniform. For example, in an exemplary embodiment, the range of the second current density J2 can be, for example: 50%×J1≤J2≤J1. Therefore, the overall average current density of the display panel 10 can be uniform.

In short, in the present embodiment, by setting the number N1 of the first inner connecting ends 161A of the first wire structure 160A carrying higher first current A1 to be greater than the number N2 of the second inner connecting ends 161B of the second wire structure 160B carrying lower first current A2 such that the first current density J1 of each of the first inner connecting ends 161A is approximate to the second current density J2 of each of the second inner connecting ends 161B, thus having a uniform average current density. Therefore, in addition to reducing the probability of high current density burning traces, the reliability and display quality of the display panel 10 can be improved.

In addition, the third wire structure 160C has a third resistance R3 greater than the first resistance R1 and the second resistance R2, and thus has a third current A3 less than that of the first wire structure 160A and the second wire structure 160B. As can be seen from the above, the third wire structure 160C only needs a smaller number N3 (for example, the third number) of the third inner connecting ends 161C to adjust the current density. As shown in FIG. 2, the third body 162C is connected to two third inner connecting ends 161C. That is, the number N3 of the third inner connecting ends 161C is less than the number N2 of the second inner connecting ends 161B. Under the above arrangement, each of the third inner connecting ends 161C has a third current density J3, $$J3 = \frac{A3}{N3},$$

and 50%×J2≤J3≤J2. That is, in the present embodiment, the relationship of the current density can be expressed by the following formula: 50%×$J_n$≤$J_{n+1}$≤$J_n$, and n is a positive integer. Thus, the average current density of the inner connecting ends (including the first inner connecting ends 161A, the second inner connecting ends 161B and the third inner connecting ends 161C) can be uniform, so as to improve the reliability and display quality of the display panel 10.

In addition, as shown in FIG. 2, the number N1 of the first inner connecting ends 161A of the first wire structure 160A is greater than the number N4 (for example, the fourth number) of the first outer connecting ends 163A. The number N2 of the second inner connecting ends 161B of the second wire structure 160B is greater than the number N5 (for example, the fifth number) of the second outer connecting ends 163B. The number N3 of the third inner connecting ends 161C of the third wire structure 160C is greater than the number N6 (for example, the sixth number) of the third outer connecting ends 163C. In addition, the number N4 of the first outer connecting ends 163A is greater than the number N5 of the second outer connecting ends 163B, and the number N5 of the second outer connecting ends 163B is greater than the number N6 of the third outer connecting ends 163C. In this way, the current input to each of the wire structures 160 can be adjusted, and the current density of each of the inner connecting ends can be further adjusted, so that the average current density of the display panel 10 can be uniform, thereby improving the reliability and display quality of the display panel 10. However, the present invention is not limited thereto.

The contact relationship between the inner connecting ends and the connection structures 140 will be further described below with a partial enlarged view of the inner connecting ends electrically connected to the connection structures 140.

Figure 3B:
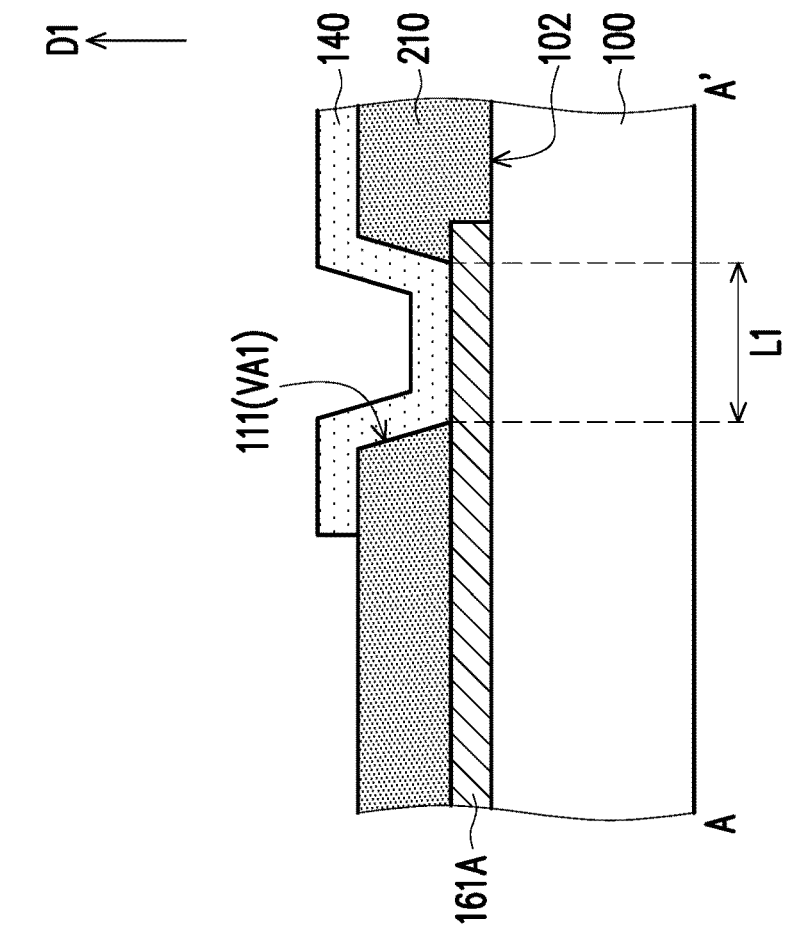
FIG. 3B is a cross-sectional view along line A-A' of the display panel of FIG. 3A.
Figure 3A:
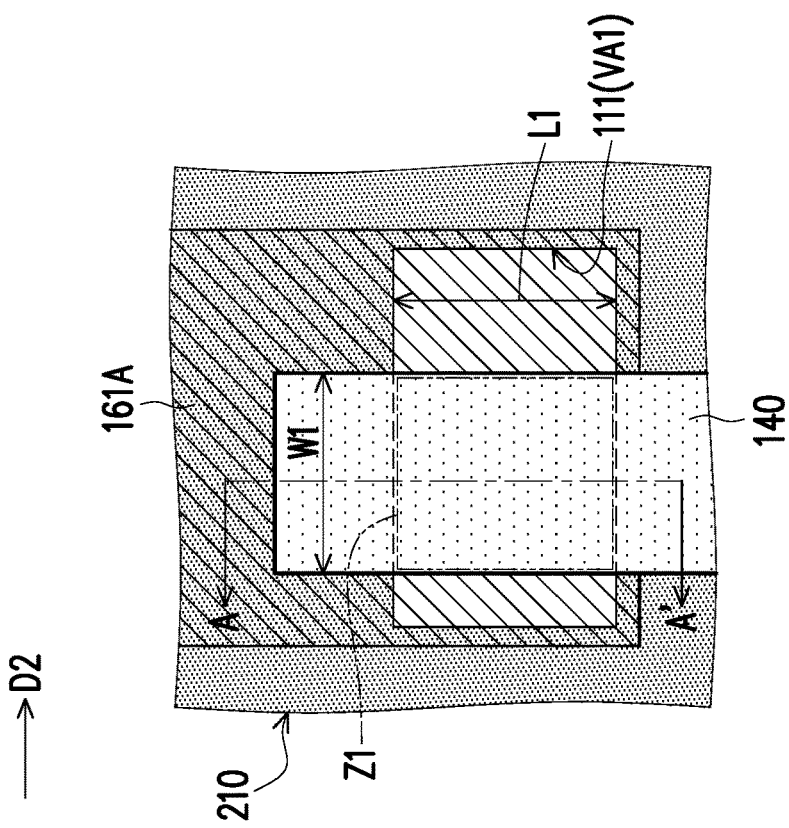
FIG. 3A is a partial top view showing a first inner connecting end of a display panel according to an embodiment of the present invention.

FIG. 3A is a partial top view showing a first inner connecting end of a display panel according to an embodiment of the present invention. FIG. 3A is a schematic illustration of only a part of the components for ease of illustration and observation. FIG. 3B is a cross-sectional view along line A-A' of the display panel of FIG. 3A. Referring to FIG. 1, FIG. 2, FIG. 3A and FIG. 3B, in the present embodiment, the insulating layer 210 covers the first inner connecting ends 161A and forms an opening VA1 on the first inner connecting end 161A. For example, the opening VA1 includes a first opening 111, and in the direction D1 perpendicular to the substrate 100, the first opening 111 correspondingly overlaps the first inner connecting end 161A and is located within the projection of the first inner connecting end 161A on the substrate 100. As shown in FIG. 3A and FIG. 3B, the connection structure 140 is disposed on the insulating layer 210 and can be filled in the first opening 111 to contact and be electrically connected to the part of the first inner connecting end 161A. In the present embodiment, the first openings 111 overlapping the first inner connecting ends 161A have the same size, but the present invention is not limited thereto.

In the present embodiment, the first opening 111 has a first length L1 in the direction perpendicular to the direction D2. The connection structure 140 has a first width W1 in the direction D2. Under the above arrangement, the contact area Z1 of the first inner connecting ends 161A and the connection structure 140 can be defined as Z1=L1×W1.

FIG. 4A is a partial top view showing a second inner connecting end of a display panel according to an embodiment of the present invention. FIG. 4A is a schematic illustration of only a part of the components for ease of illustration and observation. FIG. 4B is a cross-sectional view along line B-B' of the display panel of FIG. 4A. Referring to FIG. 1, FIG. 2, FIG. 4A and FIG. 4B, in the present embodiment, the insulating layer 210 covers the second inner connecting ends 161B and forms the openings VA1 on the second inner connecting ends 161B. For example, the opening VA1 further includes a second opening 112, and in the direction D1 perpendicular to the substrate 100, the second opening 112 correspondingly overlaps the second inner connecting end 161B and is located within the projection of the second inner connecting end 161B on the substrate 100. As shown in FIG. 4A and FIG. 4B, the connection structure 140 is disposed on the insulating layer 210 and can be filled in the second opening 112 to contact and be electrically connected to the part of the second inner connecting end 161B. In the present embodiment, the second openings 112 overlapping the second inner connecting ends 161B have the same size, but the present invention is not limited thereto.

In the present embodiment, the second opening 112 has a second length L2 in the direction perpendicular to the direction D2. The connection structure 140 has a first width W1 in the direction D2. Under the above arrangement, the contact area Z2 of the second inner connecting ends 161B and the connection structure 140 can be defined as Z2=L2×W1.

FIG. 5A is a partial top view showing a third inner connecting end of a display panel according to an embodiment of the present invention. FIG. 5A is a schematic illustration of only a part of the components for ease of illustration and observation. FIG. 5B is a cross-sectional view along line C-C' of the display panel of FIG. 5A. Referring to FIG. 1, FIG. 2, FIG. 5A and FIG. 5B, in the present embodiment, the insulating layer 210 covers the third inner connecting ends 161C and forms the openings VA1 on the third inner connecting ends 161C. For example, the opening VA1 further includes a third opening 113, and in the direction D1 perpendicular to the substrate 100, the third opening 113 correspondingly overlaps the third inner connecting end 161C and is located within the projection of the third inner connecting end 161C on the substrate 100. As shown in FIG. 5A and FIG. 5B, the connection structure 140 is disposed on the insulating layer 210 and can be filled in the third opening 113 to contact and be electrically connected to the part of the third inner connecting end 161C. In the present embodiment, the third openings 113 overlapping the third inner connecting ends 161C have the same size, but the present invention is not limited thereto.

In the present embodiment, the third opening 113 has a third length L3 in the direction perpendicular to the direction D2. The connection structure 140 has a first width W1 in the direction D2. Under the above arrangement, the contact area Z3 of the third inner connecting ends 161C and the connection structure 140 can be defined as Z3=L3×W1.

It should be noted that, please referring to FIG. 3A, FIG. 3B, FIG. 4A, FIG. 4B, FIG. 5A and FIG. 5B, when the openings have the same width, since the first length L1>the second length L2>the third length L3, the opening size of the first opening 111>the opening size of the second opening 112>the opening size of the third opening 113. From another perspective, in the direction D1 perpendicular to the substrate 100, the area of the orthogonal projection of the first opening 111 on the substrate 100 is greater than the area of the orthogonal projection of the second opening 112 on the substrate 100, and the area of the orthogonal projection of the second opening 112 on the substrate 100 is greater than the area of the orthogonal projection of the third opening 113 on the substrate 100. Under the above arrangement, when the first width W1 of the connection structure 140 is constant, the contact area Z1 of the first inner connecting ends 161A and the connection structure 140 (i.e., L1×W1) is greater than the contact area Z2 of the second inner connecting ends 161B and the connection structure 140 (i.e., L2×W1). The contact area Z2 of the second inner connecting ends 161B and the connection structure 140 is greater than the contact area Z3 of the third inner connecting ends 161C and the connection structure 140 (i.e., L3×W1).

In this way, the display panel 10 according to the present embodiment enables the first wire structure 160A carrying higher current to have a larger total contact area with the connection structure 140, and the second wire structure 160B carrying lower current has a smaller total contact area with the connection structure 140. Thereby, the average current density of the inner connecting ends can be further adjusted through the size of the opening VA1 to make it uniform, so as to improve the reliability and display quality of the display panel 10.

In addition, since the contact area of the inner connecting ends and the connection structure 140 can be controlled by adjusting the length of the opening VA1, when the connection structure 140 is horizontally displaced in the direction D2 by the manufacturing process, the contact areas of the different connection structures 140 and the different inner connecting ends respectively are still in a similar ratio. For example, the first width W1 of the connection structure corresponding to the first inner connecting ends 161A may still contact the first inner connecting ends 161A with a similar first width W1 due to the same displacement tolerance. In fact, the variable controlling the contact area is still the length of the opening VA1. Therefore, the overall average current density of the display panel 10 can be kept uniform without being affected by the manufacturing process tolerance, so as to improve the reliability and display quality of the display panel 10.

In short, since different wire structures 160 have different extension lengths, they have different resistances. For example, the extension length of the first body 162A of the first wire structure 160A is greater than the extension length of the second body 162B of the second wire structure 160B, resulting in that the second resistance R2 of the second wire structure 160B is greater than the first resistance R1 of the first wire structure 160A. Thus, the first current A1 of the first wire structure 160A is greater than the second current A2 of the second wire structure 160B. In the present embodiment, by controlling the number and total area of the inner connecting ends of the wire structure 160 contacting the connection structure 140, the number N1 of the first inner connecting ends 161A of the first wire structure 160A can be made greater than the number N2 of the second inner connecting ends 161B of the second wire structure 160B (in other words, the total contact area of the first wire structure 160A and the connection structure 140 can be greater than the total contact area of the second wire structure 160B and the connection structure 140). In this way, the current density of the first inner connecting ends 161A of the first wire structure 160A carrying higher current can be adjusted to approximate the current density of the second inner connecting ends 161B of the second wire structure 160B carrying lower current. Therefore, the average current density of different wire structures 160 can be made uniform to reduce the probability of high current density burning traces, and the display panel 10 can have a uniform average current density on the whole, so as to improve the reliability and display quality of the display panel 10.

The following embodiments follow the component numerals and partial contents of the foregoing embodiments, and the same reference numerals are used to refer to the same or similar components. For a part of the description of the same technical contents, reference may be made to the foregoing embodiment, and the detailed description is omitted in the following embodiments.

Figure 6B:
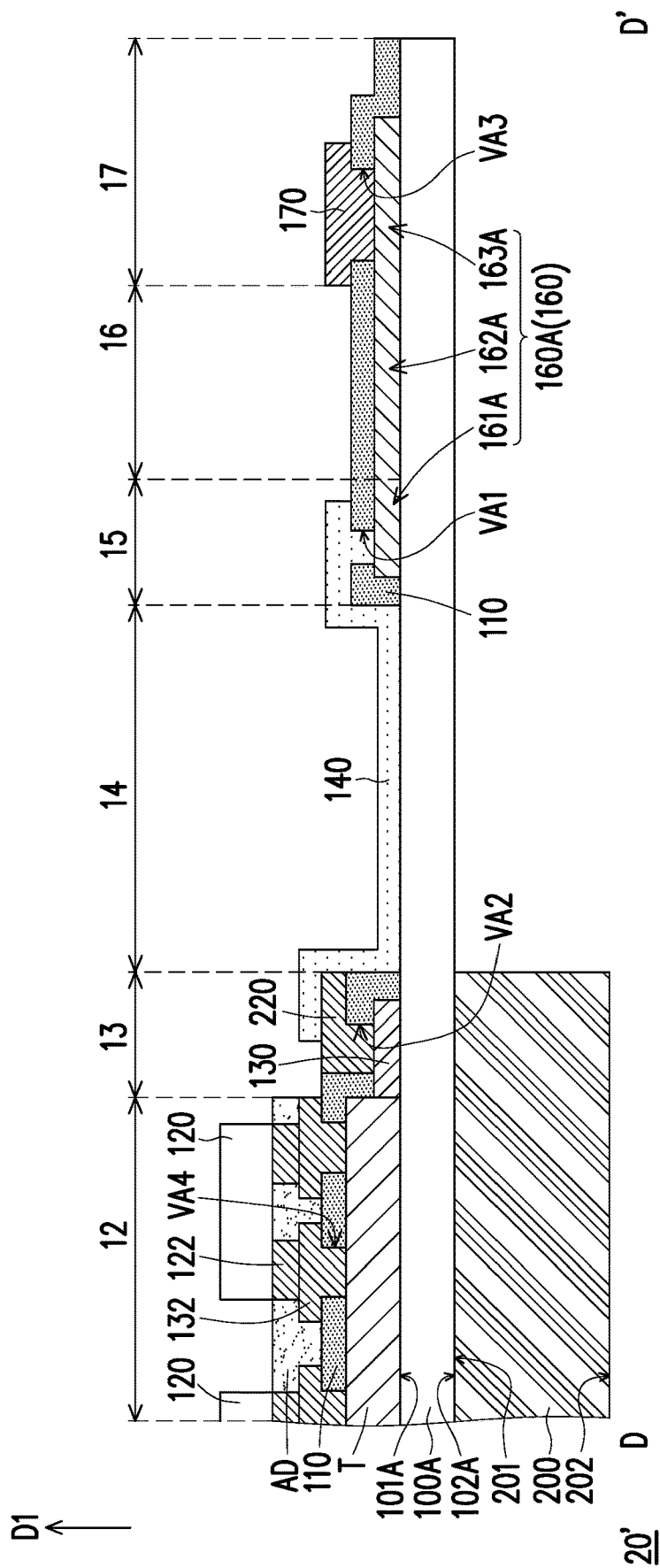
FIG. 6B is a cross-sectional view along line D-D' of the display panel of FIG. 6A before bending.
Figure 6C:
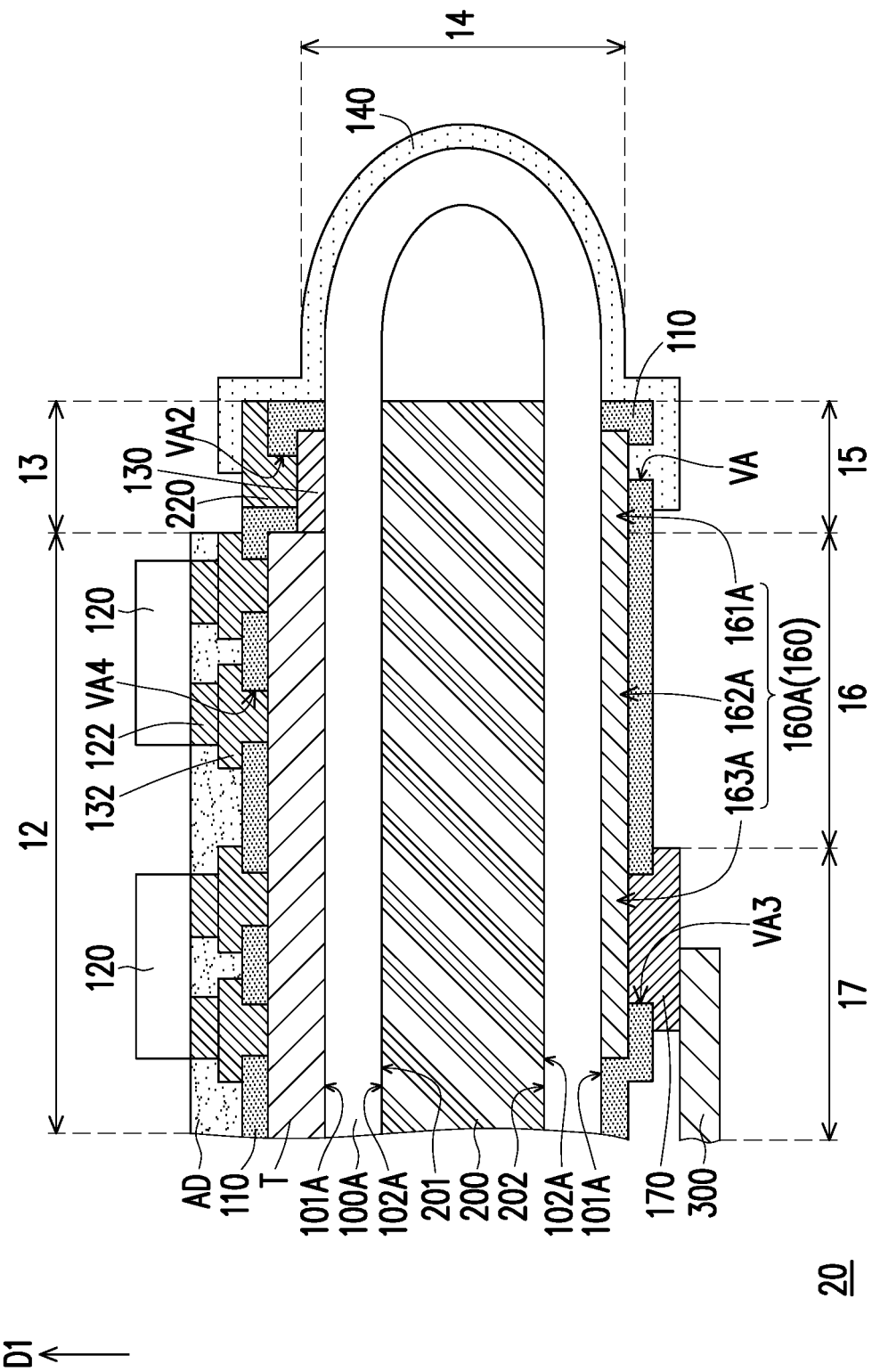
FIG. 6C is a cross-sectional view of a display panel according to another embodiment of the present invention.

FIG. 6A is a top view of a display panel before bending according to another embodiment of the present invention. FIG. 6A is a schematic illustration of only a part of the components for ease of illustration and observation. FIG. 6B is a cross-sectional view along line D-D' of the display panel of FIG. 6A before bending. FIG. 6C is a cross-sectional view of a display panel according to another embodiment of the present invention. Please referring to FIG. 1 and FIG. 6C, the display panel 20 of the present embodiment is similar to the display panel 10 of FIG. 1. The main difference is that the display panel 20 further includes a carrier plate 200, and the substrate 100A further has a bending zone 14 between the upper pad zone 13 and the pad zone 15. In the present embodiment, the display panel 20 is, for example, a display panel with a narrow bezel, and will be briefly described below with the above application.

In the present embodiment, the substrate 100A is a flexible substrate. The material of the substrate 100A may be an organic polymer, for example, polyimide (PI), polyethylene naphthalate (PEN), polyethylene terephthalate (PET), polycarbonate (PC), polyether sulfone (PES) or polyarylate, or other suitable materials, or combinations of at least two of the foregoing.

Referring first to FIG. 6A and FIG. 6B, the carrier plate 200 of the display panel 20' before bending has a first surface 201 and a second surface 202 opposite to the first surface 201. The material of the carrier plate 200 is, for example, glass, quartz, an organic polymer, an insulating material or other applicable materials. The substrate 100A is disposed on the first surface 201, and the lower surface 102A of the substrate 100A contacts the first surface 201. In the present embodiment, the active zone 12, the upper pad zone 13, the bend zone 14, the pad zone 15, the fan-out zone 16 and the external component zone 17 are located on the upper surface 101A of the substrate 100A. The active zone 12 includes a plurality of light-emitting elements 120 arranged in an array and electrically connected to the active component layer T. The active component layer T has a plurality of signal lines SL, and the signal lines SL are electrically connected to the upper pads 130.

In the present embodiment, the upper pads 130 may be arranged in a single row along the direction D2, but the present invention is not limited thereto. In some embodiments, the upper pads 130 may also be arranged in two or more rows. As shown in FIG. 6A, the plurality of wire structures 160 may also be arranged along the direction D2 and overlap the pad zone 15, the fan-out zone 16, and the external component zone 17. The outer pads 170 are disposed in the external component zone 17 and arranged in a single row along the direction D2, but the present invention is not limited thereto.

As shown in FIG. 6A, the plurality of wire structures 160 includes first wire structures 160A, second wire structures 160B and third wire structures 160C. In the present embodiment, the first wire structure 160A, the second wire structure 160B and the third wire structure 160C may be arranged along the direction D2. The first wire structures 160A are disposed between the two second wire structures 160B, and the first wire structures 160A and two second wire structures 160B are disposed between the two third wire structures 160C. The structure, shape, arrangement, and number of the plurality of wire structures 160 shown in FIG. 6A are similar to those of the plurality of wire structures 160 shown in FIG. 2, and thus are not described herein. In the present embodiment, a plurality of openings VA1 are disposed correspondingly to each of the first inner connecting ends 161A, the second inner connecting ends 161B and the third inner connecting ends 161C, and a plurality of openings VA3 are disposed correspondingly to each of the first outer connecting ends 163A, the second outer connecting ends 163B and the third outer connecting ends 163C. The plurality of outer pads 170 overlap the openings VA3 to be electrically connected to the first outer connecting ends 163A, the second outer connecting ends 163B and the third outer connecting ends 163C through the openings VA3.

In the present embodiment, the plurality of connection structures 140 are disposed in the bending zone 14, and the two opposite ends of the connection structure 140 respectively contact the upper pad 130 or the inner connecting end of the wire structure 160 (for example, the first inner connecting end 161A, the second inner connecting end 161B or the inner connecting end 161C) to electrically connect the upper pad 130 to the corresponding inner connecting end. In the present embodiment, the connection structure 140 may be, for example, a metal wire, but the present invention is not limited thereto. In some embodiments, the connection structure 140 may also be a wire made of other suitable conductive materials.

As shown in FIG. 6A, the connection structures 140 include a plurality of first connection structures 141 and a plurality of second connection structures 142. In some embodiments, the connection structures 140 further include a plurality of third connection structures 143. A part of the first connection structures 141 correspondingly overlap the first inner connecting ends 161A and are electrically connected to the first inner connecting ends 161A through the openings VA1. A part of the second connection structures 142 correspondingly overlap the second inner connecting ends 161B and are electrically connected to the second inner connecting ends 161B through the openings VA1. In addition, a part of the third connection structures 143 correspondingly overlap the third inner connecting ends 161C and are electrically connected to the third inner connecting ends 161C through the openings VAL The manufacturing method of the display panel 20 will be briefly described below.

Referring to FIG. 6A, FIG. 6B and FIG. 6C, first, the active component layer T, the plurality of upper pads 130, the insulating layer 110, the plurality of contacts 132, the adhesive layer AD and the plurality of light-emitting elements 120 are sequentially formed in the corresponding active zone 12 or upper pad zone 13. Next, the plurality of wire structures 160 (FIG. 6B is a cross-sectional view of the first wire structure 160A), the insulating layer 110 and the plurality of outer pads 170 are respectively sequentially formed in the corresponding pad zone 15, fan-out zone 16 or external component zone 17. It should be noted that the insulating layer 110 formed in the active zone 12 and the upper pad zone 13 may be completed in the same manufacturing step as the insulating layer 110 formed in the pad zone 15, the fan-out zone 16 or the external component zone 17, and has the same material and belongs to the same film layer. In addition, the insulating layer 110 may also form a plurality of openings VA1, VA2, VA3 and VA4 through the same patterning process, but the present invention is not limited thereto. In some embodiments, the insulating layer 110 overlapping the active zone 12 and the upper pad zone 13 and the insulating layer 110 overlapping the pad zone 15, the fan-out zone 16 and the external component zone 17 may also be separately disposed and patterned. Then, a plurality of connection structures 140 are formed in the bending zone 14, and the two opposite ends of the connection structure 140 respectively overlap a part of the upper pad zone 13 and a part of the pad zone 15. Thus, one end of the connection structure 140 can contact the upper pad 130, and the other end can contact the wire structure 160 (the inner connecting end 161A of the first wire structure 160A as shown in FIG. 6B and FIG. 6C) through the opening VA1.

Next, referring to FIG. 6B and FIG. 6C, the substrate 100A is disposed on the first surface 201 of the carrier plate 200. Then, the substrate 100A is subjected to a bending process to bend the substrate 100A at the bending zone 140. Under the above arrangement, the active zone 12 and the upper pad zone 13 of the substrate 100A are located on the first surface 201 of the carrier plate 200. The pad zone 15, the fan-out zone 16 and the external component zone 17 are located on the second surface 202 of the second surface 200. Thus, the substrate 100A can be bent from the first surface 201 of the carrier plate 200 to the second surface 202 through the bending zone 14 such that the lower surface 102A of the substrate 100A opposite to the upper surface 101A is bonded to the second surface 202 of the carrier plate 200. Finally, the external circuit component 300 is electrically connected to the outer pad 170 to provide the driving signal and current of the external circuit component 300 to the light-emitting element 120. Thus, the manufacturing of the display panel 20 has been completed. In the display panel 20 of the present embodiment, since the zone of the substrate 100A on which the outer pad 170 and the wire structure 160 are formed may be bent back to the second surface 202 of the carrier plate 200 (for example, the back surface of the carrier plate 200, which is a non-display zone), the need for a narrow bezel can be achieved.

In short, the number N1 of the first inner connecting ends 161A of the first wire structure 160A of the display panel 20 of the present embodiment is greater than the number N2 of the second inner connecting ends 161B of the second wire structure 160B. Thus, the current density of the first inner connecting ends 161A of the first wire structure 160A carrying higher current can be adjusted to approximate the current density of the second inner connecting ends 161B of the second wire structure 160B carrying lower current. Therefore, in addition to reducing the probability of high current density melting traces, the display panel 20 can have a uniform average current density, so as to improve the reliability and display quality of the display panel 20. In addition, the need for a narrow bezel can be easily achieved by bending back the substrate 100A.

FIG. 7A is a partial top view showing a first inner connecting end of a display panel according to still another embodiment of the present invention. FIG. 7A is a schematic illustration of only a part of the components for ease of illustration and observation. Referring to FIG. 3A and FIG. 7A, the first connection structure 141 of the present embodiment is similar to the connection structure 140 of FIG. 3A. The main difference is that the second width W2 of the first connection structure 141 is greater than the first width W1 of the connection structure 140 of FIG. 3A. Specifically, the first opening 111 has a length L' in the direction perpendicular to the direction D2, and under the above arrangement, the contact area Z1' of the first inner connecting ends 161A and the first connection structure 141 can be defined as Z1'=L'×W2. In other words, the embodiment shown in FIG. 7A controls the magnitude of the contact area Z1' by the magnitude of the second width W2 of the first connection structure 141. In this way, the current density of the first inner connecting ends 161A can be further adjusted.

FIG. 7B is a partial top view showing a second inner connecting end of a display panel according to still another embodiment of the present invention. FIG. 7B is a schematic illustration of only a part of the components for ease of illustration and observation. Referring to FIG. 7A and FIG. 7B, the second connection structure 142 of the present embodiment is similar to the first connection structure 141 of FIG. 7A. The main difference is that the second width W2 of the first connection structure 141 of FIG. 7A is greater than the third width W3 of the second connection structure 142 of FIG. 7B, and under the above arrangement, the contact area Z2' of the second inner connecting ends 161B and the second connection structure 142 can be defined as Z2'=L'×W3. In other words, the contact area Z1' is greater than the contact area Z2'. Accordingly, the embodiment shown in FIG. 7B is similar to the embodiment of FIG. 7A described above in that the magnitude of the contact area Z2' is controlled by the magnitude of the third width W3 of the second connection structure 142. In this way, the current density of the second inner connecting ends 161B can be further adjusted and the technical effect similar to that of the above embodiment can be obtained.

It should be noted that, referring to FIG. 7A and FIG. 7B, under the above arrangement, the first wire structure 160A carrying higher current has a larger contact area Z1' due to contact with the wider first connection structure 141. The second wire structure 160B carrying lower current has a smaller contact area Z2' due to contact with the narrower second connection structure 142. Thereby, the average current density of the first inner connecting ends 161A and the second inner connecting ends 161B can be uniform, and the technical effect similar to that of the above embodiment can be obtained.

Based on the above, the display panel according to an embodiment of the present invention has different resistances and currents due to different extension lengths of different wire structures, so that the number of the first inner connecting ends of the first wire structure can be made greater than the number of the second inner connecting ends of the second wire structure by controlling the number and total area of the inner connecting ends of the connection structure contacting the connection structure. In this way, the average current density of the wire structures carrying different currents can be made uniform to reduce the probability of high current density burning traces, and the display panel can have a uniform average current density on the whole. In this way, in addition to reducing the probability of high current density burning traces, the reliability and display quality of the display panel can be improved.

In addition, the display panel according to another embodiment of the present invention can also control the total contact area of the inner connecting ends and the connection structure through the size of the openings to further adjust the average current density of the inner connecting ends to be uniform, so as to improve the reliability and display quality of the display panel.

Furthermore, the display panel according to still another embodiment of the present invention can also control the size of the contact area of the inner connecting ends and the connection structure by adjusting the width of the connection structure. Thereby, the average current density of the inner connecting ends can be uniform to further improve the reliability and display quality of the display panel.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A display panel, comprising:
a substrate, having an active zone, a pad zone, an external component zone, and a fan-out zone between the pad zone and the external component zone;
a plurality of light-emitting elements, disposed in the active zone; and
a plurality of wire structures, disposed in the fan-out zone, the pad zone and the external component zone, wherein the wire structures comprise a first wire structure and a second wire structure, the first wire structure comprises a plurality of first inner connecting ends, a plurality of first outer connecting ends, and a first body electrically connected to the first inner connecting ends and the first outer connecting ends, the first inner connecting ends are located between the light-emitting elements and the first body, the second wire structure comprises a plurality of second inner connecting ends, a plurality of second outer connecting ends, and a second body electrically connected to the second inner connecting ends and the second outer connecting ends, the second inner connecting ends are located between the light-emitting elements and the second body, wherein
the first wire structure comprises a first current A1, the second wire structure comprises a second current A2, and A1>A2; and
a number of the first inner connecting ends of the first wire structure is N1, a number of the second inner connecting ends of the second wire structure is N2, and N1>N2.

2. The display panel according to claim 1, wherein the first inner connecting ends and the second inner connecting ends are disposed in the pad zone, the first outer connecting ends and the second outer connecting ends are disposed in the external component zone, the first body and the second body are disposed in the fan-out zone, each of the first inner connecting ends has a first current density J1, $$J1 = \frac{A1}{N1},$$

each of the second inner connecting ends has a second current density J2, $$J2 = \frac{A2}{N2},$$

and $50\% \times J1 \leq J2 \leq J1$.

3. The display panel according to claim 1, wherein the first wire structure has a first resistance R1, the second wire structure has a second resistance R2, and R2>R1.

4. The display panel according to claim 1, further comprising:
a plurality of upper pads, electrically connected to the light-emitting elements; and
a plurality of connection structures, the connection structures electrically connecting the upper pads to the wire structures.

5. The display panel according to claim 4, wherein the substrate comprises an upper surface and a lower surface opposite to the upper surface, the light-emitting elements and the upper pads are located on the upper surface of the substrate, and the wire structures are located on the lower surface of the substrate.

6. The display panel according to claim 4, wherein the connection structures respectively contact the first inner connecting ends of the first wire structure and the second inner connecting ends of the second wire structure, and the total contact area of the first inner connecting ends and the connection structures is greater than the total contact area of the second inner connecting ends and the connection structures.

7. The display panel according to claim 6, wherein the connection structures respectively comprise a first width W1.

8. The display panel according to claim 4, wherein the connection structures comprise a plurality of first connection structures and a plurality of second connection structures, the first connection structures are electrically connected to the first inner connecting ends, the second connection structures are electrically connected to the second inner connecting ends, at least one of the first connection structures comprises a second width W2, at least one of the second connection structures comprises a third width W3, and W2>W3.

9. The display panel according to claim 4, wherein the substrate further has a bending zone and an upper pad zone, the bending zone is located between the upper pad zone and the pad zone, the connection structures are disposed in the bending zone, and the active zone, the upper pad zone, the bending zone, the pad zone, the fan-out zone and the external component zone are located on an upper surface of the substrate.

10. The display panel according to claim 9, further comprising a carrier plate having a first surface and a second surface opposite to the first surface, wherein the substrate is a flexible substrate, the active zone and the upper pad zone of the substrate are located on the first surface of the carrier plate, and the pad zone, the fan-out zone and the external component zone are located on the second surface of the carrier plate, and the substrate is bent at the bending zone such that a lower surface of the substrate opposite to the upper surface is bonded to the second surface of the carrier plate.

11. The display panel according to claim 4, further comprising an insulating layer covering the wire structures, the insulating layer having a plurality of openings, the openings comprising a plurality of first openings and a plurality of second openings, wherein in a direction perpendicular to the substrate, the first openings correspondingly overlap the first inner connecting ends, the second openings correspondingly overlap the second inner connecting ends, and an area of an orthogonal projection of each of the first openings on the substrate is greater than an area of an orthogonal projection of each of the second openings on the substrate.

12. The display panel according to claim 11, wherein the connection structures are respectively electrically connected to the first inner connecting ends of the first wire structure and the second inner connecting ends of the second wire structure, and the connection structures respectively comprise a first width W1.

13. The display panel according to claim 4, further comprising a plurality of outer pads disposed in the external component zone and respectively electrically connected to the first outer connecting ends and the second outer connecting ends.

14. The display panel according to claim 13, further comprising an external circuit component electrically connected to the outer pads, wherein the external circuit component is electrically connected to the light-emitting elements through the wire structures, the connection structures and the upper pads.

15. The display panel according to claim 1, wherein a number N4 of the first outer connecting ends of the first wire structure is greater than a number N5 of the second outer connecting ends of the second wire structure, wherein N1>N4, and N2>N5.

16. A display panel, comprising:
a substrate, having an active zone, a pad zone, an external component zone, and a fan-out zone between the pad zone and the external component zone;
a plurality of light-emitting elements, disposed in the active zone; and
a plurality of wire structures, disposed in the fan-out zone, the pad zone and the external component zone, wherein the wire structures comprise a first wire structure and a second wire structure, the first wire structure comprises a plurality of first inner connecting ends, a plurality of first outer connecting ends, and a first body electrically connected to the first inner connecting ends and the first outer connecting ends, the second wire structure comprises a plurality of second inner connecting ends, a plurality of second outer connecting ends, and a second body electrically connected to the second inner connecting ends and the second outer connecting ends;
wherein a number of the first inner connecting ends of the first wire structure is N1, and a number of the second inner connecting ends of the second wire structure is N2,
wherein the first wire structure comprises a first current A1, the second wire structure comprises a second current A2, and A1>A2,
wherein each of the first inner connecting ends has a first current density J1, $$J1 = \frac{A1}{N1},$$

each of the second inner connecting ends has a second current density J2, $$J2 = \frac{A2}{N2},$$

and $50\% \times J1 \leq J2 \leq J1$.

* * * * *